United States Patent [19]
Wu

[11] Patent Number: 6,156,591
[45] Date of Patent: Dec. 5, 2000

[54] METHOD OF FABRICATING CMOS TRANSISTORS WITH SELF-ALIGNED PLANARIZATION TWIN-WELL BY USING FEWER MASK COUNTS

[75] Inventor: Shye-Lin Wu, Hsinchu, Taiwan

[73] Assignee: Texas Instruments - Acer Incorporated, Hsinchu, Taiwan

[21] Appl. No.: 09/008,157

[22] Filed: Jan. 16, 1998

[51] Int. Cl.[7] .................................................. H01L 2/8238
[52] U.S. Cl. ......................... 438/199; 438/217; 438/228; 438/231
[58] Field of Search ..................................... 438/199, 282, 438/228, 217, 276, 231

[56] References Cited

U.S. PATENT DOCUMENTS

| | | | |
|---|---|---|---|
| 4,906,588 | 3/1990 | Harrington, III | 437/44 |
| 5,278,441 | 1/1994 | Kang et al. | 257/371 |
| 5,573,963 | 11/1996 | Sung | 438/207 |
| 5,576,570 | 11/1996 | Ohsawa et al. | 257/369 |
| 5,606,191 | 2/1997 | Wang | 257/336 |
| 5,650,341 | 7/1997 | Yang et al. | 438/217 |
| 5,736,415 | 4/1998 | Chang et al. | 438/203 |
| 5,747,368 | 5/1998 | Yang et al. | 438/217 |
| 5,929,493 | 7/1999 | Wu | 438/228 |

*Primary Examiner*—John F. Niebling
*Assistant Examiner*—Walter L. Lindsay, Jr.
*Attorney, Agent, or Firm*—Harness, Dickey & Pierce, P.L.C.

[57] ABSTRACT

The present invention discloses a method of forming CMOS transistors with self-aligned planarization twin-well by using fewer mask counts. After a silicon nitride layer is formed over a pad oxide layer on a semiconductor substrate, an n-well region is defined by implanting a high energy dose phosphorous in the semiconductor substrate. When the photoresist layer used for defining the n-well is stripped, a high energy and low dose blanket boron is implanted under the n-well region in the semiconductor substrate. Next, both the silicon nitride layer and the pad oxide layer are removed. A high temperature steam oxidation process is then performed to remove the crystalline defects, and the in-situ high temperature long time anneal is done to form a deep twin-well. A thick pad oxide layer formed by the high temperature steam oxidation is then removed, and an active region is defined followed by a standard oxidation process to grow a thick field oxide region. After a phosphorous punch-through stopping implant is performed in the semiconductor substrate for the PMOSFET, another high energy and low dose blanket boron is implanted in a semiconductor substrate for increasing the threshold voltage of the NMOSFET field oxide device. Both the threshold voltages of the buried channel PMOSFET and surface channel NMOSFET are then adjusted by a low energy and low dose blanket $BF_2$ implant. Finally, the standard processes can be employed for fabricating the CMOS transistors.

19 Claims, 5 Drawing Sheets

METHOD OF FABRICATING CMOS TRANSISTORS WITH SELF-ALIGNED PLANARIZATION TWIN-WELL BY USING FEWER MASK COUNTS

BACKGROUND OF THE INVENTION

1. Field of the Invention

The invention relates to a method of forming a twin-well for CMOS (Complementary Metal-Oxide-Semiconductor) transistors, and more particularly, to a method of forming a self-aligned planarization twin-well for CMOS transistors by using fewer mask counts than conventional skills.

2. Description of the Prior Art

In the present days, CMOS transistors make more and more devices because the CMOS structures offer a lot of advantages such as low power consumption than NMOS and PMOS transistors. There are many technologies used to fabricate the CMOS transistors, such as p-well, n-well, and twin-well processes. As noted, the twin-well process is the most attractive scheme utilized for fabricating CMOS products because many advantages offered by the twin-well technology. For example, the doping profile of each of the device types can be set independently since the constraint of single-well CMOS does not exist.

All persons skilled in the art know that a planar surface should be prepared before performing sequence processes of forming CMOS transistors. However, it is difficult to obtain a true planarized self-aligned twin-well for CMOS transistors, especially for deep sub-micro ULSI (Ultra-Large-Scale-Integrated) applications that are the main electronic products today (refer to "0.2-$\mu$m n-Channel and p-Channel MOSFET's Integrated on Oxidation-Planarized Twin-Tubs" in IEEE Electron Device Lett., vol., EDL-11, p. 500–502, 1996.) A requirement has been arisen to disclose a process for overcoming the aforementioned disadvantages while fabricating CMOS transistors.

SUMMARY OF THE INVENTION

Accordingly, the present invention discloses a method of preparing a planarized self-aligned twin-well for CMOS transistors. After a silicon nitride layer is formed over a pad oxide layer on a semiconductor substrate, an n-well region is defined by implanting a high energy dose phosphorous in the semiconductor substrate. When the photoresist layer used for defining the n-well is stripped, a high energy and low dose blanket boron is implanted against the n-well region in a semiconductor substrate. Next, both the silicon nitride layer and the pad oxide layer are removed. A high temperature steam oxidation process is then performed to remove the crystalline defects, and the in-situ high temperature long time anneal is done to form a deep twin-well. When a thick pad oxide layer grown by the high temperature steam oxidation is removed, an active region is defined followed by a standard oxidation process to grow a thick field oxide layer. After a phosphorous punch-through stopping implant is performed in the semiconductor substrate for the PMOSFET, another high energy and low dose blanket boron is implanted in a semiconductor substrate for increasing the threshold voltage of the NMOSFET field oxide device. Then, both the threshold voltages of the buried channel PMOSFET and surface channel NMOSFET are adjusted by a low energy and low dose blanket $BF_2$ implant. Finally, the standard processes can be employed for fabricating the CMOS transistors.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
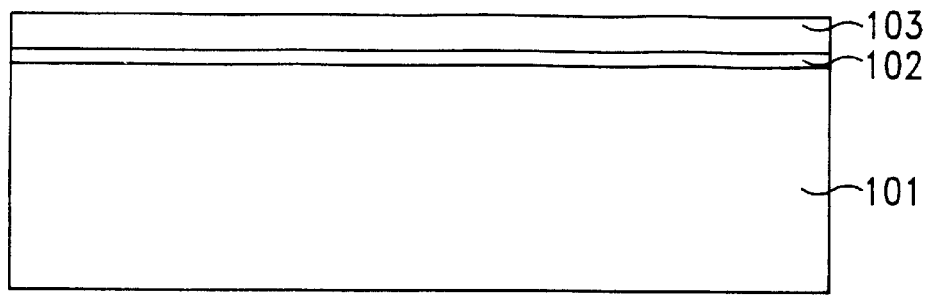
FIG. 1 is a cross section of a semiconductor substrate representative of when a silicon nitride layer is formed over a pad oxide layer on the semiconductor substrate.
Figure 2:
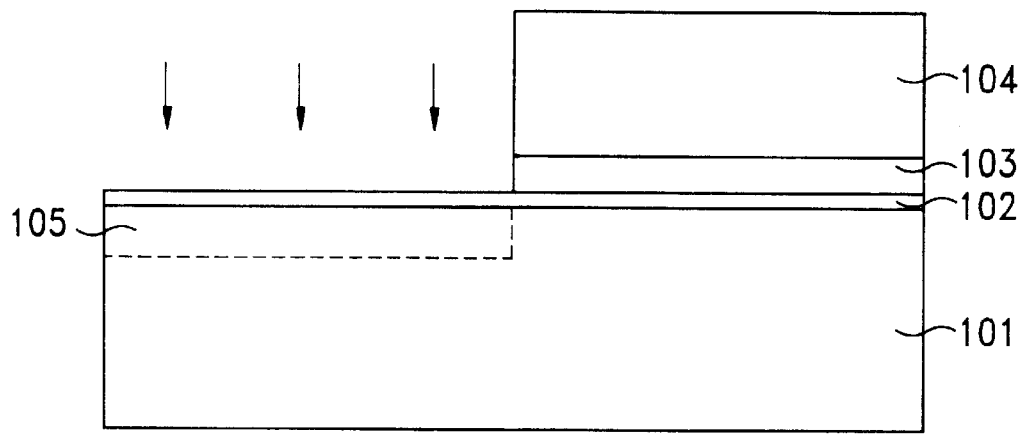
FIG. 2 illustrates a cross-sectional view of the semiconductor substrate representative of when phosphorous ions are implanted to define an n-well region in the semiconductor substrate.

FIG. 1 is a cross section of a semiconductor substrate 101 representative of when a silicon nitride layer 103 with a thickness of about 500 to 3000 Å (angstrom) is formed over a pad oxide layer 102. The pad oxide layer 102 is composed of silicon dioxide with a thickness of about 30 to 500 Å. The silicon nitride layer 103 is then patterned to define an n-well region. Next, a high energy ion implantation is performed to form the n-well region 105 by using a photoresist layer 104 as a mask. The source of the ion implementation is n(conductive) type ions, such as phosphorous or the like. FIG. 2 illustrates a cross-sectional view representative of when phosphorous ions are implanted to form the n-well region 105 in the semiconductor substrate 101. The depth of the n-well 105 is about 0.1 to 1 μm, and the implanted phosphorous ions are at an energy about 100 KeV to 3.0 MeV, and at a dose between 5E11 to 5E13 atoms/cm$^2$.

Figure 3:
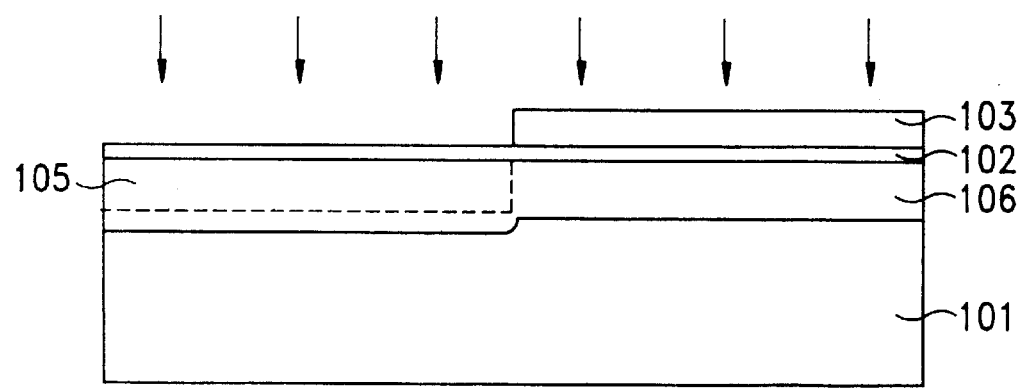
FIG. 3 represents a cross section illustrative of when a high energy and low dose blanket boron is implanted in a semiconductor substrate when the photoresist layer used for defining the n-well is stripped.
Figure 4:
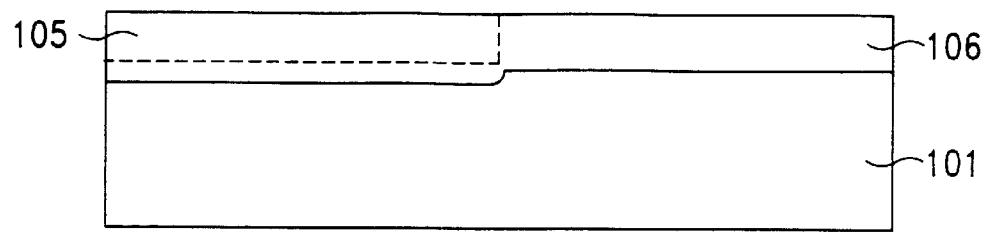
FIG. 4 demonstrates a cross section of the semiconductor substrate when the silicon nitride layer and the pad oxide layer are completely removed.

After the photoresist 104 is stripped, a high energy and low dose blanket implantation is performed to form a doped region 106 against the n-well region 105. Typically, the doped region 106 is formed by implanting p-type ions such as boron or the like. FIG. 3 illustrates a cross-sectional view of the semiconductor substrate 101 after the doped region 106 is formed. The doped boron ions are at an energy about 100 KeV to 3.0 MeV, and at a dose between 5E11 to 5E13 atoms/cm$^2$. The silicon nitride layer 103 and the pad oxide layer 102 are the removed, and the cross section of the semiconductor substrate 101 when the nitride layer 103 and the pad oxide layer 102 are completely removed is demonstrated in FIG. 4.

Figure 5:
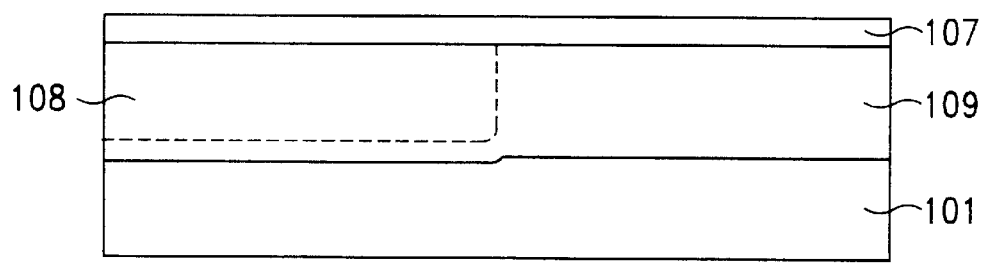
FIG. 5 shows a cross-sectional view of the semiconductor substrate when a high temperature wet oxidation is performed to remove crystalline defects and then in-situ anneal.
Figure 6:
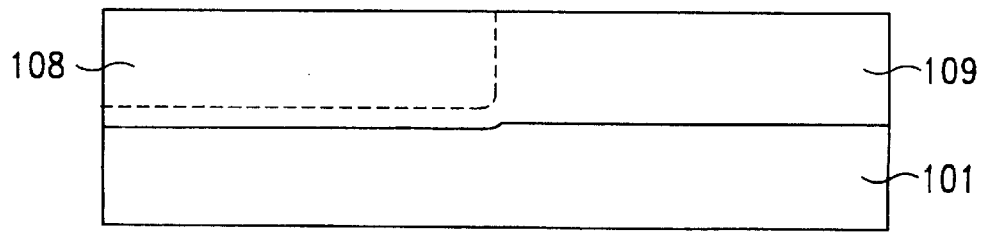
FIG. 6 is a cross-sectional view after a thick pad oxide layer formed by the high temperature oxidation is completely removed.
Figure 7:
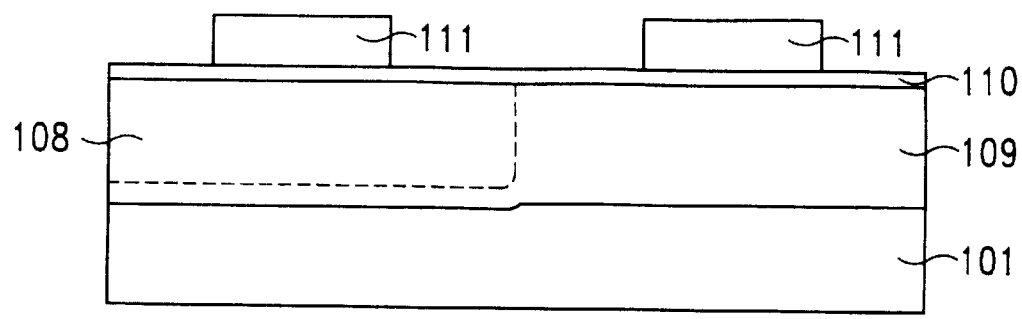
FIG. 7 shows a cross section illustrative of when a second silicon nitride layer is patterned over a second pad oxide layer on the semiconductor substrate.
Figure 8:
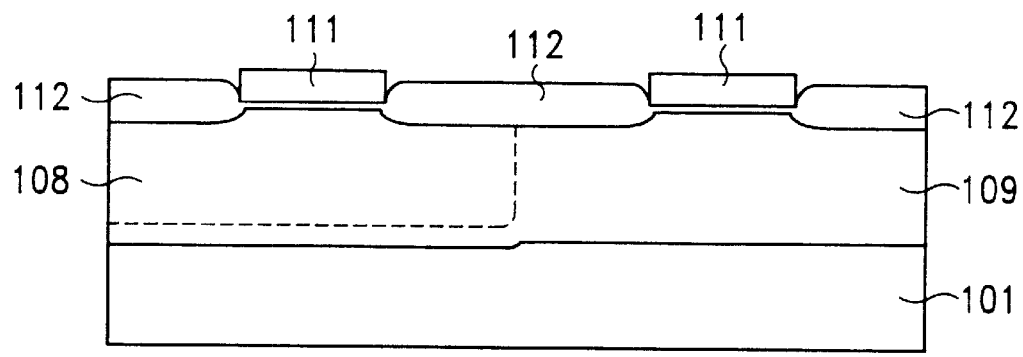
FIG. 8 depicts a cross section of the semiconductor substrate after a thermal oxidation is applied to grow a field oxide layer on the semiconductor substrate.
Figure 9:
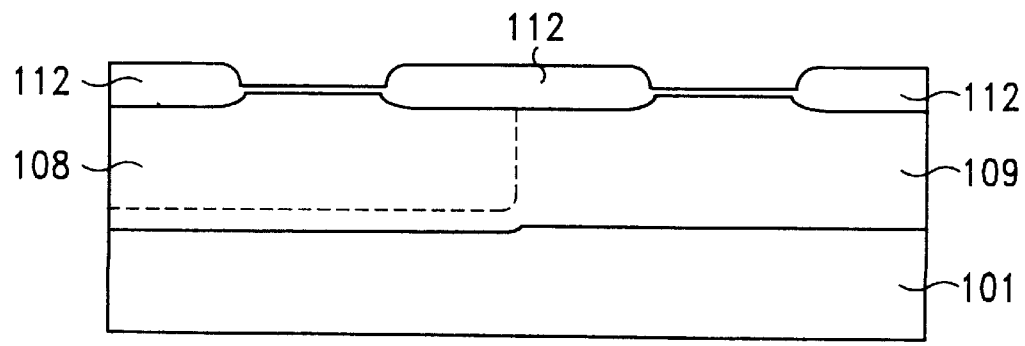
FIG. 9 represents a cross-sectional view after the second nitride layer is completely removed.

Referring to FIG. 5, which represents a cross section illustrative of when a high temperature steam oxidation is performed to eliminate surface crystalline defects. Furthermore, the in-situ high temperature anneal is performed long enough to form a deep twin-well encompassing an n-well 108 and a p-well 109. An oxide layer 107 with a thickness of about 500 to 5000 Å is also grown on the surface of the semiconductor substrate 101 due to the oxidation. The thick pad oxide layer 107 grown by the oxidation is then removed, and the cross section of the semiconductor substrate 101 after the thick pad oxide layer 107 being removed is described in FIG. 6. Next, the standard processes for defining active regions can be continued. Referring to FIG. 7, which shows a cross section illustrative of when a second silicon nitride layer 111 is patterned over a second pad oxide layer 110 on the semiconductor substrate 101 to define the active regions. FIG. 8 depicts a cross section of the semiconductor substrate 101 after a thermal oxidation is applied to grow a field oxide region 112 on the semiconductor substrate 101. And, FIG. 9 represents a cross-section view after the second nitride layer 111 is completely removed.

Figure 10:
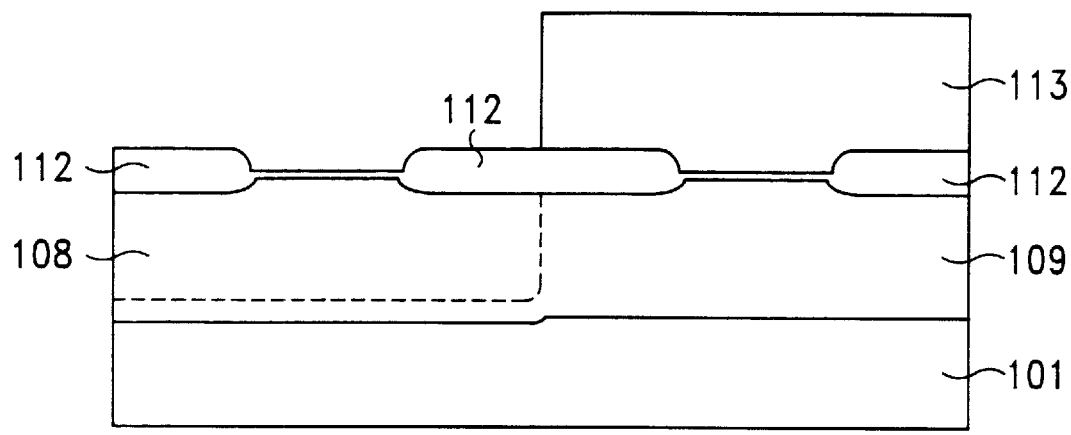
FIG. 10 illustrates a cross-sectional view after a second photoresist layer is patterned on the semiconductor substrate.
Figure 11:
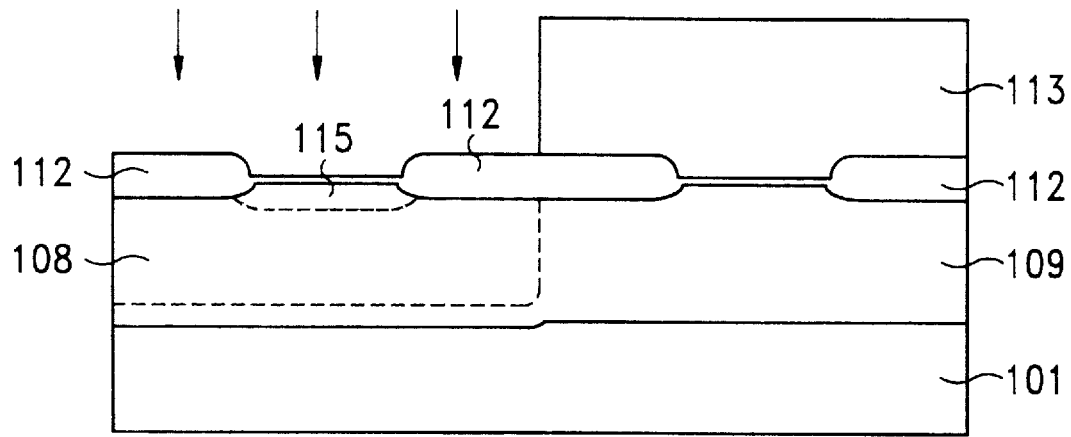
FIG. 11 displays a cross-sectional view that a phosphorous punch-through stopping implantation is performed by implanting a second high energy and low dose blanket boron in a semiconductor substrate by the second photoresist layer as a mask.

Please referring to FIG. 10, which illustrates a cross-section view when a second photoresist layer 113 is patterned on the semiconductor substrate 101 to expose the n-well 108. Then, a punch-through stopping layer 115 for the PMOSFET is formed in the semiconductor substrate 101. Typically, the punch-through stopping layer 115 is formed by implanting a high energy and low dose blanket phosphorous and in accompanied with the second photoresist layer 113 as a mask. The implanted phosphorous ions are at an energy about 100 to 300 KeV, and at a dose between 5E11 to 5E13 atoms/cm$^2$. FIG. 11 displays a cross-sectional view when the punch-through stopping layer 115 is formed.

Figure 12:
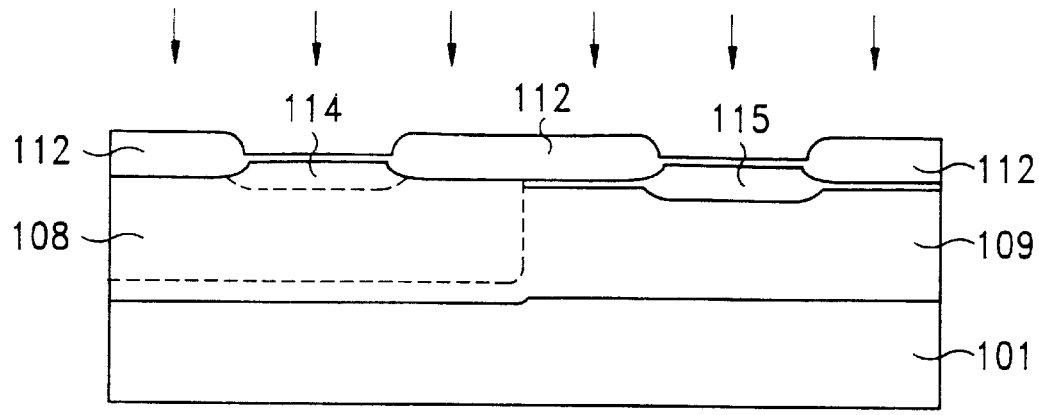
FIG. 12 demonstrates a cross section of the semiconductor substrate after a third high energy and low dose boron blanket implantation is performed in the semiconductor substrate.
Figure 13:
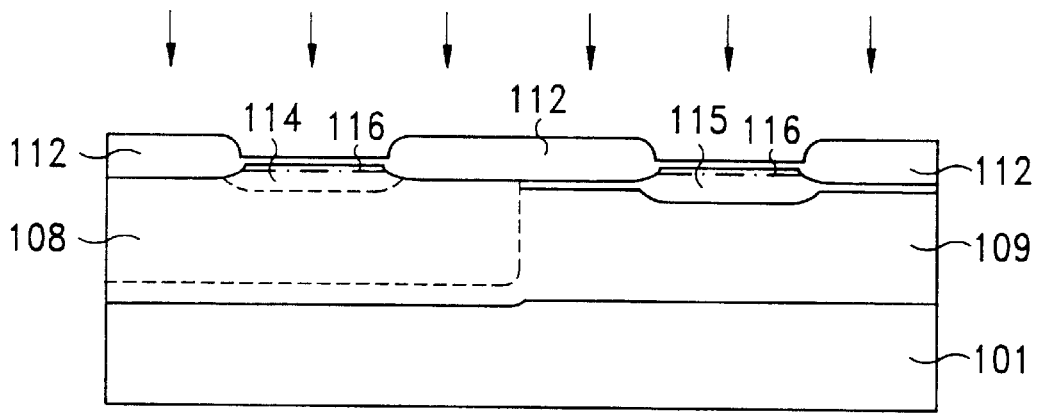
FIG. 13 shows a cross section representative of when a low energy and low $BF_2$ ion implantation is performed to the semiconductor substrate.

Then, a high energy and low dose boron blanket implantation is applied to form the optimal impurity profiles and thus to increase the threshold voltage of the NMOSFET. The high energy and low dose boron blanket implementation can also increase the threshold voltage of the field oxide device, which has been used for ESD (Electro-Static Discharge) protection circuit. Thus, this action can improve the ESD performance (refer to the article titled "Degradation of I/O Device due to ESD-Induced Dislocations" disclosed by Hashimoto et al.) FIG. 12 demonstrates a cross section of the semiconductor substrate 101 when a high energy and low dose boron blanket implantation is performed after the second photoresist layer 113 is removed. The implanted boron ions are at an energy about 100 to 300 KeV, and at a dose between 1E11 to 1E13 atoms/cm Finally, there prepares a planarized twin-well for CMOS transistor after a low energy and low dose BF$_2$ ion implantation is performed for adjusting the threshold voltages of both the NMOSFET and PMOSFET. FIG. 13 shows a cross section representative of when the low energy and low BF$_2$ ion implantation is performed to form an adjusting layer 116 that adjusts the threshold voltage of the CMOS transistors. The implanted BF$_2$ ions are at an energy about 10 to 150 KeV, and at a dose between 1E12 to 1E14 atoms/cm$^2$.

It is obvious that a planarized topography between n- and p-wells can be easily obtained. In addition, there are fewer masks required in the invention when compared with conventional CMOS technology because those masks used for p-well implant, channel stop implant, P-Vt (threshold voltage of PMOS) and N-Vt (threshold voltage of NMOS) implants can be eliminated. Moreover, traditional recipe is manufacturable for the present invention.

Figure 14:
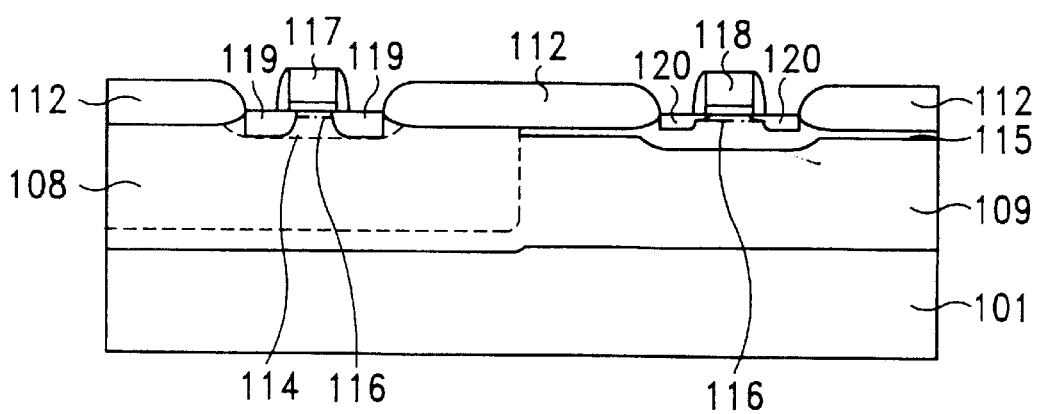
FIG. 14 is a cross section of the semiconductor substrate when a CMOS transistor is fabricated on the semiconductor substrate.

When the isolation regions are completely made for semiconductor devices, sequence processes for fabricating CMOS transistors are thus continued. For example, in FIG. 14 that shows a cross section illustrative of when a gate structure 117, and source and drain 119 for the PMOSFET, and forming a gate structure 118, and source and drain 120 for the NMOSFET.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming a twin-well CMOS (Complementary Metal-Oxide-Semiconductor) transistor with reducing masks, said method comprising the steps of:

forming a first pad oxide layer on a substrate;

forming a first nitride layer on said first pad oxide layer;

patterning a first photoresist layer to define a first well region; performing a first ion implantation in said first well region by using said first photoresist layer as a mask;

removing said first photoresist layer;

performing a second ion implantation in said substrate to define a second well region;

removing said first nitride layer and said first pad oxide layer;

performing an oxidation to said substrate;

defining an active region on said substrate;

patterning a second photoresist layer to expose said first well region;

performing a third ion implantation in said first well region to form a first punch-through stopping layer;

removing said second photoresist layer;

performing a fourth ion implantation to increase a voltage threshold of a field oxide region;

performing a fifth ion implantation to adjust a voltage threshold of said CMOS transistor; and forming said CMOS transistor on said first well region and said second well region, said step of defining an active region comprising the steps of:

forming a second pad oxide layer on said substrate;

forming a second nitride layer on said second pad oxide layer;

patterning said second silicon layer to define said active region; and forming said field oxide region by using said second silicon nitride layer as a mask.

2. The method according to claim 1, wherein a step of etching back portion of said first silicon nitride layer to expose portion of said first pad oxide layer is performed before performing said first ion implantation.

3. The method according to claim 1, wherein said first ion implantation is doped phosphorous ions at an energy between about 100 KeV to 3.0 MeV, at a dose between about 5E11 to 5E13 atoms/cm$^2$.

4. The method according to claim 1, wherein said second ion implantation performs a boron blanket implantation at an energy between about 100 KeV to 3.0 MeV, at a dose between about 5E11 to 5E13 atoms/cm$^2$.

5. The method according to claim 1, wherein a step of removing a thick oxide layer formed by said oxidation is performed before defining active region.

6. The method according to claim 5, wherein a thickness of said thick oxide layer is about 500 to 5000 Å.

7. The method according to claim 1, wherein portion of said field oxide region is covered by said second photoresist layer.

8. The method according to claim 1, wherein said second silicon nitride layer is removed before patterning said second photoresist layer.

9. The method according to claim 1, wherein said third ion implantation is doped phosphorous ions at an energy between about 100 to 300 KeV, at a dose between about 5E11 to 5E13 atoms/cm$^2$.

10. The method according to claim 1, wherein said fourth ion implantation is doped boron ions at an energy between about 100 to 300 KeV, at a dose between about 1E11 to 1E13 atoms/cm$^2$.

11. The method according to claim 1, wherein said fifth ion implantation is doped BF$_2$ ions at an energy between about 10 to 150 KeV, at a dose between about 1E12 to 1E14 atoms/cm$^2$.

12. A method of forming a twin-well CMOS (Complementary Metal-Oxide-Semiconductor) transistor, said method comprising the steps of:

forming a first pad oxide layer on a substrate;

forming a first silicon nitride layer on said first pad oxide layer;

patterning a first photoresist layer on said silicon nitride layer to define a first well region;

etching back portion of said first silicon nitride layer to expose portion of said first pad oxide layer by using said first photoresist layer as a mask;

performing a first ion implantation in said first well region by using said first photoresist layer as a mask;

removing said first photoresist layer;

performing a second ion implantation in said substrate to define a second well region;

removing said first silicon nitride layer and said first pad oxide layer;

performing an oxidation to said substrate;

removing a thick oxide layer formed by said oxidation;

forming a second pad oxide layer on said substrate;

forming a second silicon nitride layer on said second pad oxide layer;

patterning said second silicon nitride layer;

forming a field oxide region by using said second silicon nitride layer as a mask;

removing said second silicon nitride layer;

patterning a second photoresist layer to expose said first well region;

performing a third ion implantation in said first well region to form a punch-through stopping layer;

removing said second photoresist layer;

performing a fourth ion implantation to increase a threshold voltage of said field oxide region;

performing a fifth ion implantation to adjust threshold voltages of said CMOS transistor; and forming said CMOS transistor on said first well region and said second well region.

13. The method according to claim 12, wherein said first ion implantation is doped phosphorous ions at an energy between about 100 KeV to 3.0 MeV, at a dose between about 5E11 to 5E13 atoms/cm$^2$.

14. The method according to claim 12, wherein said second ion implantation performs a boron blanket implantation at an energy between about 100 KeV to 3.0 MeV, at a dose between about 5E11 to 5E13 atoms/cm$^2$.

15. The method according to claim 12, wherein a thickness of said thick oxide layer is about 500 to 5000 Å.

16. The method according to claim 12, wherein portion of said field oxide region is covered by said second photoresist layer.

17. The method according to claim 12, wherein said third ion implantation is doped phosphorous ions at an energy between about 100 to 300 KeV, at a dose between about 5E11 to 5E13 atoms/cm$^2$.

18. The method according to claim 12, wherein said fourth ion implantation is doped boron ions at an energy between about 100 to 300 KeV, at a dose between about 1E11 to 1E13 atoms/cm$^2$.

19. The method according to claim 12, wherein said fifth ion implantation is doped BF$_2$ ions at an energy between about 10 to 150 KeV, at a dose between about 1E12 to 1E14 atoms/cm$^2$.

* * * * *